United States Patent
Chien et al.

(10) Patent No.: US 10,512,946 B2
(45) Date of Patent: Dec. 24, 2019

(54) GIGASONIC CLEANING TECHNIQUES

(71) Applicant: Taiwan Semiconductor Manufacturing Co., Ltd., Hsin-Chu (TW)

(72) Inventors: Ying-Hsueh Chang Chien, Hsinchu (TW); Chi-Ming Yang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 425 days.

(21) Appl. No.: 14/844,406

(22) Filed: Sep. 3, 2015

(65) Prior Publication Data

US 2017/0066021 A1    Mar. 9, 2017

(51) Int. Cl.
| | |
|---|---|
| B08B 3/12 | (2006.01) |
| H01L 21/67 | (2006.01) |
| H01L 21/02 | (2006.01) |
| C11D 11/00 | (2006.01) |
| B06B 3/00 | (2006.01) |
| H01L 21/66 | (2006.01) |

(52) U.S. Cl.
CPC ............ B08B 3/12 (2013.01); C11D 11/007 (2013.01); C11D 11/0047 (2013.01); H01L 21/02057 (2013.01); H01L 21/67057 (2013.01); *B06B 3/00* (2013.01); *H01L 22/12* (2013.01); *H01L 22/26* (2013.01)

(58) Field of Classification Search
CPC ............... B08B 3/12; H01L 21/02057; H01L 21/67057; C11D 11/0047; B06B 3/00
See application file for complete search history.

(56) References Cited

U.S. PATENT DOCUMENTS

| | | | | | |
|---|---|---|---|---|---|
| 4,358,204 | A | * | 11/1982 | Ellner ................ | B08B 3/12 366/118 |
| 4,854,337 | A | * | 8/1989 | Bunkenburg ......... | B08B 3/12 134/184 |
| 6,036,785 | A | * | 3/2000 | Ferrell ................ | B08B 3/12 134/1 |
| 6,085,764 | A | * | 7/2000 | Kobayashi ........... | B08B 3/10 134/147 |
| 6,276,370 | B1 | * | 8/2001 | Fisch ................. | B08B 3/12 134/1.3 |
| 2004/0163682 | A1 | * | 8/2004 | Boyd ................. | B08B 3/12 134/33 |

(Continued)

OTHER PUBLICATIONS

TwoViews, Ultrasounds, Aug. 1, 2018, Two Views, paragraph discussing frequency of ultrasound including gigahertz (Year: 2018).*

Primary Examiner — Joseph L. Perrin
Assistant Examiner — Irina Graf
(74) Attorney, Agent, or Firm — Eschweiler & Potashnik, LLC

(57) ABSTRACT

The present disclosure provides a semiconductor cleaning system. The cleaning system includes a chamber to retain a cleaning solution, and a gigasonic frequency generator. The gigasonic frequency generator is configured to generate an electrical signal corresponding to a range of gigahertz frequencies. A transducer is configured to transform the electrical signal to a mechanical wave of pressure and displacement that propagates through the cleaning solution with oscillations within the range of gigahertz frequencies.

20 Claims, 5 Drawing Sheets

(56) References Cited

U.S. PATENT DOCUMENTS

| | | | |
|---|---|---|---|
| 2004/0238005 A1* | 12/2004 | Takayama | B08B 3/00 134/18 |
| 2005/0284362 A1* | 12/2005 | Kim | H01L 21/68735 118/52 |
| 2006/0006761 A1* | 1/2006 | Goodson | B06B 1/0284 310/317 |
| 2007/0126069 A1* | 6/2007 | Muchow | B81B 3/0021 257/414 |
| 2012/0024313 A1* | 2/2012 | Rastegar | B06B 1/0276 134/1 |
| 2015/0206738 A1* | 7/2015 | Rastegar | B08B 3/12 134/1 |

* cited by examiner

GIGASONIC CLEANING TECHNIQUES

BACKGROUND

Semiconductor device fabrication is a process used to create integrated circuits that are present in everyday electrical and electronic devices. The fabrication process is a multiple-step sequence of photolithographic and chemical processing steps during which electronic circuits are gradually created on a wafer composed of a semiconducting material. Silicon is an example of a typical semiconductor material used in the fabrication process, however other types of semiconductor materials can be utilized.

Unwanted contaminants and/or particles can become present during the fabrication process. A cleaning process is typically used to attempt removal of these unwanted particles.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
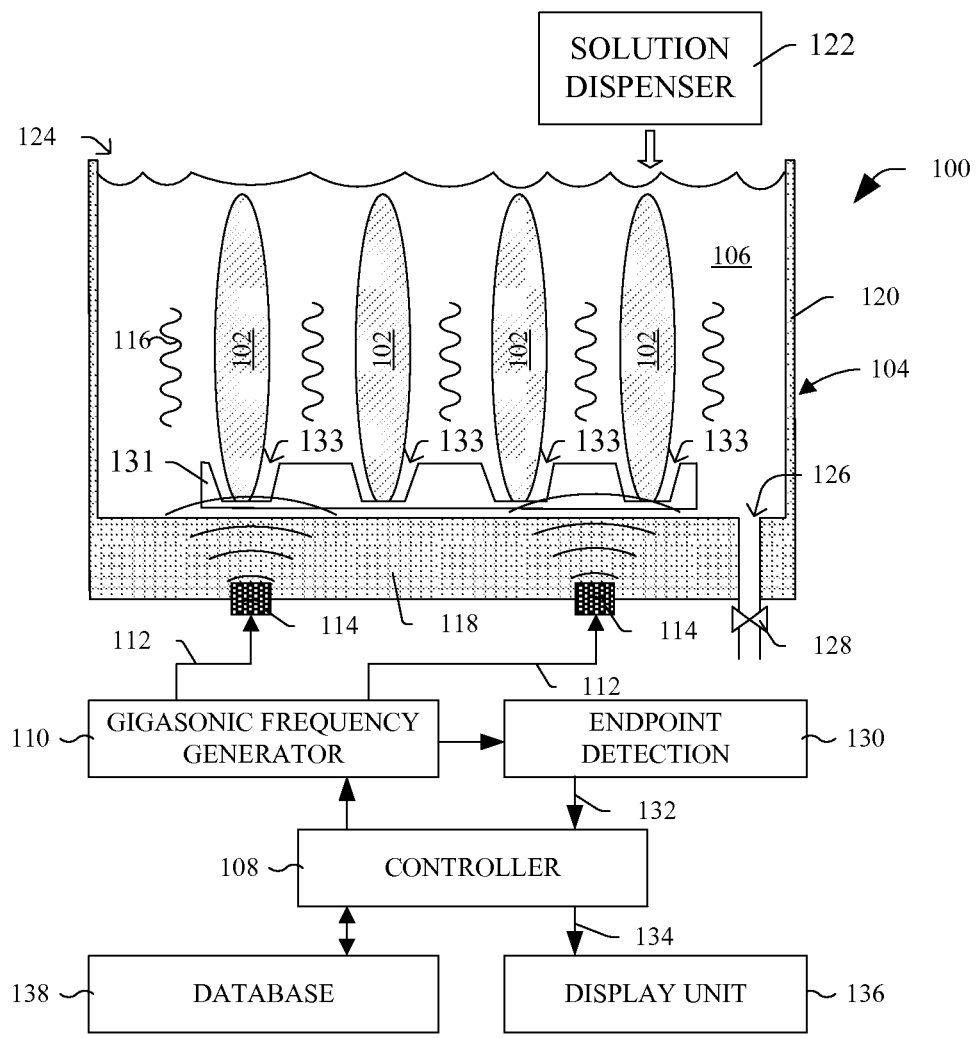
FIGS. 1A, 1B, 1C and 1D are block diagrams illustrating gigasonic cleaning systems in accordance with some embodiments.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Contaminants or unwanted particles, which can be much smaller than dust particles, can adhere to surfaces of semiconductor wafers during fabrication. For example, the air of a fabrication facility (fab) can include unwanted airborne particles, chemical reagents and aqueous cleaning solutions can include unwanted particles or contaminants, and process tools in the fab can transfer contaminants or particles between wafers, etc. Some examples of contaminants and particles can include dust, dirt, oil, pigments, rust, grease, algae, fungus, bacteria, polishing compounds, flux agents, fingerprints, residues, mold release agents, biological agents such as blood or perspiration, and so on.

Because of the risk of defects due to these contaminants or unwanted particles, fabs utilize extensive cleanroom technology to limit the number of airborne particles (and size of those particles) present in the fab environment. Nonetheless, unwanted particles and contaminants still come into contact with semiconductor devices during fabrication. These particles and contaminants, if not removed, can degrade device performance by altering and/or interfering with device operations. For example, contaminants or particles that adhere to a surface location on a wafer can alter electrical characteristics of the device or create a short at that surface location. Because of the extremely small feature sizes of modern integrated circuits, which can be in the range of tens of nanometers, even miniscule particles/contaminants can result in problems for semiconductor devices.

Ultrasonic cleaning is one type of acoustic cleaning that has been used to attempt to dislodge contaminants from a surface of a substrate. Ultrasonic cleaning uses high frequency pressure (sound) waves to agitate a liquid, thereby inducing cavitation (streams of bubbles) that exert large forces on contaminants or particles adhering to a semiconductor wafer. In an ultrasonic cleaner, the wafer is placed in a chamber containing a suitable cleaning solution. An ultrasonic transducer produces ultrasonic waves in the cleaning solution by generating an electrical signal oscillating at ultrasonic frequency. This signal creates compression waves in the cleaning solution of the chamber which 'tear' the liquid of the cleaning solution apart, leaving behind many millions of microscopic 'voids' or 'partial vacuum bubbles' (cavitation). These bubbles collapse with enormous energy; such that temperatures and pressures on the order of 5,000 K and 20,000 lbs per square inch are achieved. The extremely small size of these bubbles helps them to penetrate blind holes, cracks, and recesses, to clean and remove surface dirt and contaminants from semiconductor wafers.

However, the present disclosure brings to light an appreciation that at small feature sizes of modern ICs, cavitation and its induced bubbles can actually damage small-scale features of an IC. For example, when an IC layer (e.g., metal line, gate electrode, or photoresist feature) is made up of features having respective minimum widths resolvable by lithography (e.g., such as on the order of 10 nanometers (nm) in modern processes), and neighboring features have a minimum spacing there between, cavitation and its induced bubbles can topple, strip, or otherwise damage these small scale structures. Thus, when the final integrated circuit is tested, it may exhibit failures to do the missing or damaged small-scale features. Moreover, ultrasonic cleaning frequencies are less capable of penetrating the recesses of modern small scale features (e.g., less than 30 nm, or even less than 20 nm), due to the flow velocities and barrier layers involved at these small scales.

Accordingly, the present disclosure relates to gigasonic cleaning techniques that are better suited for cleaning modern ICs than conventional ultrasonic cleaning techniques. Unlike ultrasonic cleaning techniques, the gigasonic cleaning techniques provide a large, streamlined flow velocity without cavitation. Because there is no cavitation, these gigasonic cleaning techniques limit damage which occurs in conventional acoustic cleaners. These gigasonic cleaning techniques can be used for a wide range of workpiece shapes, sizes and materials, and are not limited to semiconductor wafers, but in general are applicable to any part, tool, or device to be cleaned.

FIG. 1A is a block diagram illustrating a gigasonic cleaning system 100 in accordance with some embodiments. The gigasonic cleaning system 100 is provided and described in a simplified form in order to facilitate understanding, and it is appreciated that variations are contemplated including, adding additional components not shown. In the gigasonic cleaning system 100, one or more wafers 102 are placed in a chamber 104 which retains a cleaning solution 106. As described in detail hereafter, under the direction of controller 108, a gigasonic frequency generator 110 produces an electrical signal 112 corresponding to a frequency in a gigahertz range. In some embodiments, the frequency can include sub-giga hertz frequencies of 100 MHz to 999 MHz, frequencies of up to 10 GHz, and other gigahertz frequencies. The electrical signal 112 is provided to one or more gigasonic transducers 114, which can be built into the chamber 104 or selectively lowered into and raised from the cleaning solution 106. The gigasonic transducers 114 transform the electrical signal 112 into gigasonic compression waves 116 in the cleaning solution 106 without inducing cavitation in the cleaning solution 106. Rather than an electromagnetic wave, these gigasonic compression waves are mechanical waves of pressure and displacement that propagate through the cleaning solution 106 with oscillations in the gigahertz range. Because there is no cavitation, this gigasonic cleaning system 100 limits damage which occurs in conventional cleaners due to induced bubbles. Further, because the gigasonic frequency is higher than a corresponding acoustic frequency, the wavelength of the compression waves 116 in the gigasonic cleaning system 100 is smaller than that of an acoustic cleaner. This reduced wavelength allows gigasonic cleaning to remove smaller particles from smaller recesses and/or smaller trenches on the wafers 102 than acoustic cleaners. Thus, the gigasonic cleaning system provided herein can thoroughly remove unwanted particles and traces of contamination that are tightly adhered or embedded onto surfaces of wafers 102.

More particularly, the chamber 104 includes a bottom plate 118 and sidewalls 120 extending upwardly from the bottom plate 118, thereby enabling the chamber 104 to retain cleaning solution 106. A cleaning solution dispenser 122 is configured to fill the chamber 104 with cleaning solution 106 through an inlet opening 124 in the chamber 104. A cleaning fluid outlet 126 is configured to drain or expel the cleaning solution 106 from the chamber 104. Generally, the cleaning solution provided by the cleaning solution dispenser 122 is filtered to be substantially free of contaminants and unwanted particles, while the expelled solution exiting the cleaning fluid outlet 126 can include removed particles and contaminants that were dislodged from the surface of the wafers 102. In some embodiments, the cleaning solution 106 is de-ionized water, while in other embodiments the cleaning solution 106 is an organic cleaning solution. The cleaning solution 106 can include a surfactant, such as a cleaning detergent in some embodiments. Further, in some embodiments the cleaning solution 106 can include a dilute chemical solution, such as an acidic solution or a basic solution to enhance cleaning. Because gigasonic frequencies enable the cleaning solution 106 to reliably penetrate small scale openings and trenches on the wafers 102, lower concentrations of cleaning chemicals can be employed, which leads to lower surface etching. In one example, a lower or dilute concentration of cleaning chemicals includes NH3:H2O2:H2O at a concentration of 1:1:100 and is suitable as the cleaning solution 106 using the gigasonic frequencies whereas a non-gigasonic frequency system could require NH3:H2O2:H2O at a concentration of 1:2:50. In some embodiments, the cleaning solution dispenser 122 and cleaning fluid outlet 126 work in coordinated fashion under direction of controller 108. For example, the controller 108 can open exit valve 128 to drain any used cleaning solution from the chamber 104, then close the exit valve 128 and trigger the cleaning solution dispenser 122 to dispense new cleaning fluid into the chamber 104. The cleaning solution dispenser 122 can alternatively be disposed in a sidewall 120 or bottom plate 118 of the chamber 104, and the cleaning solution 106 can also be circulated, either continuously or intermittently, from the cleaning solution dispenser 122 through the chamber 104 and out the cleaning fluid outlet 126 by a pump (not shown), or can be circulated within the chamber 104 with the cleaning fluid outlet 126 being closed.

Further still, in some embodiments during use of the gigasonic cleaning system 100, the chamber 104 has a pressure and/or a temperature that are elevated relative to a pressure and/or a temperature of the ambient environment of the gigasonic cleaning system 100. To achieve an elevated pressure and/or temperature, the chamber 104 may include a lid (not shown), which can be closed after the wafers 102 are placed in the chamber 104. A heating element (not shown), which can be integrated into the chamber 104 or selectively inserted into the chamber 104, can then heat the cleaning solution 106 to achieve the desired pressure and/or temperature. In the illustrated embodiment where the chamber 104 is essentially a basin with an open top, the cleaning is typically carried out at ambient pressure (typically approximately 1 atmosphere) and at a predetermined temperature.

The chamber 104 is of sufficient size that one or more wafers 102 can be sub-merged in the cleaning solution 106 during cleaning. Typically, the wafers 102 are fully submerged during cleaning, but a wafer 102 could be only partially submerged if less than less the entire surface of the wafer is to be cleaned. For example, in some embodiments, the chamber 104 can have a depth of at least 300 mm, a width of at least 300 mm, and a length of at least 300 mm, which equates to a cleaning solution volume of slightly more than 7 gallons. In some embodiments, the wafers 102 are first loaded onto a wafer support 131, which may be referred to as a wafer boat in some applications, before being loaded into the chamber 104. The wafer support 131, which is often removable from the chamber 104, is then placed into the chamber 104 so a lower surface or legs of the wafer support 131 rest on a top surface of the bottom plate 118. The wafer support 131 can have a plurality of ridges or grooves 133 that have a fixed size to receive and retain a plurality of wafers 102, respectively. Often, the wafers 102 are retained with a vertical orientation such that the wafers 102 are oriented in parallel with one another so faces of neighboring wafers face one another. This arrangement may help provide streamlined flow of the between faces of neighboring wafers during cleaning, although wafers can also be retained in a horizontal orientation whereby faces or neighboring wafers are vertically over one another. Although the illustrated example shows four wafers arranged with vertical orientations, it is contemplated that a single wafer could also be processed by itself in the chamber 104, or many more wafers, such as twenty five or fifty wafers (or many more) for example, could also be disposed on one or more wafer supports 131 within the chamber in vertical or horizontal orientation.

In some embodiments, a wafer 102 can be a bulk silicon substrate or a semiconductor-on-insulator (SOI) substrate (e.g., silicon on insulator substrate). A wafer 102 can also be a binary semiconductor substrate (e.g., GaAs), a tertiary semiconductor substrate (e.g., AlGaAs), a higher order semiconductor substrate, or even a sapphire substrate, for example. A wafer 102 can include doped regions formed in or on the substrate, epitaxial layers formed in or on the substrate, insulating layers formed in or on the substrate, photoresist layers formed in or on the substrate, and/or conducting layers formed in or on the substrate. In many instances, a wafer can have a diameter of 1-inch (25 mm); 2-inch (51 mm); 3-inch (76 mm); 4-inch (100 mm); 5-inch (130 mm) or 125 mm (4.9 inch); 150 mm (5.9 inch, usually referred to as "6 inch"); 200 mm (7.9 inch, usually referred to as "8 inch"); 300 mm (11.8 inch, usually referred to as "12 inch"); or 450 mm (17.7 inch, usually referred to as "18 inch"); for example. Although gigasonic cleaning is applicable to any size of wafer, gigasonic cleaning is particularly beneficial in wafers having diameters of 300 mm or larger and which utilize advanced technology nodes with minimum feature sizes of 20 nm or less, as gigasonic cleaning techniques provided herein can limit or avoid damage that can occur with conventional cleaning approaches which use cavitation.

The gigasonic transducers 114 are mounted to the bottom plate 118, and at least partially fill one or more corresponding transducer openings in the bottom plate 118. The gigasonic transducer(s) 114 are configured to direct a gigasonic compression wave into the cleaning solution 106. The transducer opening(s) extend vertically into a lower surface of the bottom plate 118, such that the gigasonic transducer(s) 114 have upper surface that are below an upper surface of the bottom plate 118. In some embodiments, the gigasonic transducer(s) 114 are in direct fluid communication with the cleaning solution 106. If in direct fluid communication with the cleaning solution 106, the gigasonic transducer(s) 114 are laterally surrounded by one or more seals, typically ring-shaped seals, to prevent fluid from escaping from the chamber 104 through the transducer opening(s). Additionally, the gigasonic transducers 114 can be configured to continuously generate the gigasonic compression wave(s) or generate the wave(s) as a series of pulses.

An endpoint detection unit 130 is electrically coupled to the controller 108. If the endpoint detection unit 130 detects that that the wafers 102 have been sufficiently cleaned, an endpoint signal 132 may be generated and transmitted to the controller 108. In some embodiments, the endpoint detection unit 130 can be implemented as a timer, which measures a time during which gigasonic cleaning is applied to the wafers 102. When the cleaning time as measured by the endpoint detection unit 130 has a predetermined relationship with a predetermined time, the endpoint signal 132 can be triggered. For example, if gigasonic cleaning is to occur for a predetermined time of two minutes, the predetermined time could be two minutes measured from the initial start of cleaning, and the predetermined relationship would be met when the elapsed cleaning time is equal to two minutes. In other embodiments, the endpoint detection unit 130 can use optical imaging to monitor the surfaces of the wafers 102 to determine when contaminants and/or unwanted particles are sufficiently removed, or can monitor the cleaning solution 106 to determine when contaminant- or unwanted particle-concentrations are sufficiently "flat" over time. If this "flat" condition is detected, which can indicate that contaminants or unwanted particles are no longer being dislodged from the surfaces of wafers 102 in a significant manner, the endpoint signal 132 can also be asserted.

Upon the endpoint detection unit 130 signaling that the wafers 102 are sufficiently clean, the controller 108, in turn, removes the wafers 102 from the chamber 104. The controller 108 may also determine whether the cleaning solution 106 is to be emptied from the chamber 104; and if so, the controller 108 may open the exit valve 128 to drain the cleaning solution 106. The controller 108 may optionally clean the chamber 104, for example, by rinsing the chamber with cleaning solution from cleaning solution dispenser 122, then close the exit valve 128 and trigger the cleaning solution dispenser 122 to re-fill the chamber with new cleaning solution. The controller 108 may also provide a display signal 134, such as a visual or audio signal, to a display unit 136 to indicate cleaning is complete, the chamber is being cleaned, the chamber is being filled, etc. The controller 108 can also forward status information regarding the gigasonic cleaning system 100 and/or wafers 102 which are in the gigasonic cleaning system 100 to a database 138 that tracks processing of wafer lots through the fabrication facility, such that the database 138 can update the status and location of wafers in the fabrication facility. Multiple gigasonic cleaning systems such as 100, as well as other process tools can report data to database 138 to help ensure manufacturing progresses in a streamlined manner.

Figure 1B:
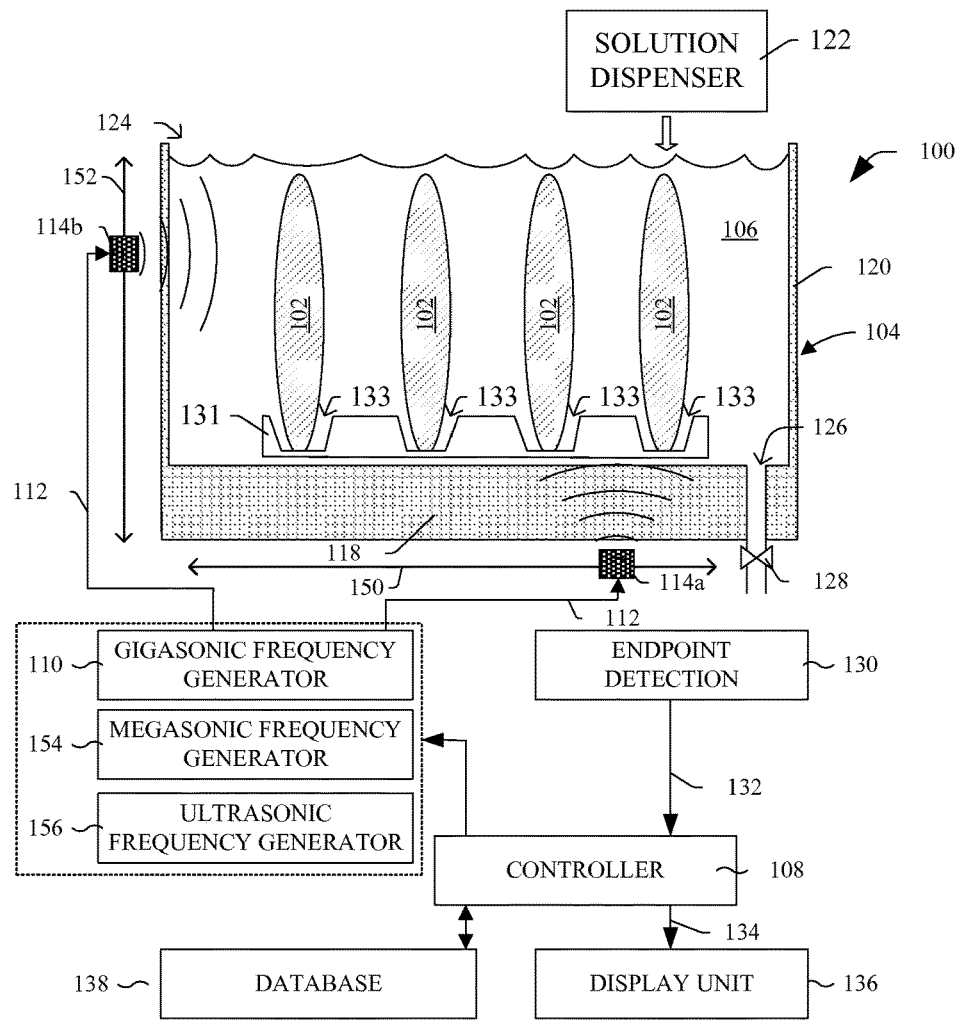

The illustrated gigasonic cleaning system 100 is shown with two transducers 114 in this example, however it is appreciated that other numbers of transducers can be utilized. Additionally, the two transducers 114 are shown as being fixed, in FIG. 1A. It is appreciated that alternatives are contemplated that move or scan the transducers 114, such as to scan sonic energy across the semiconductor device from one end to the other. For example, as shown in FIG. 1B, one of the transducers (e.g., a first transducer 114a) can be positioned along an x-axis 150 running from left to right along a bottom surface of the chamber 104. Under direction of the controller 108, the first transducer 114a can generate first transducer energy or waves at a first frequency with a first power level. The first transducer energy propagates from the first transducer towards the wafers 102. The first frequency can include a range of frequencies, such as a range of gigasonic frequencies. Meanwhile, another of the transducers (e.g., second transducer 114b) can be positioned along a y-axis 152 running from top to bottom of a sidewall of the chamber 104. Under direction of the controller 108, the second transducer 114b can generate second transducer energy or waves at a second frequency with a second power level. The second transducer energy propagates from the second transducer towards the wafers 102. The second frequency can include a range of frequencies, such as a range of gigasonic frequencies. The second frequency can be the same or varied from the first frequency. In one example, only the second frequency includes a gigasonic frequency. In another example, only the first frequency includes a gigasonic frequency. Thus, the use of first and second transducers 114a, 114b may offer flexibility in cleaning processes, and help to improve cleaning efficiency and/or throughput.

Further still, as shown in FIG. 1B, in some embodiments the cleaning system 100B can select between different frequencies depending on the particle size to be removed. Thus, the controller 108 in FIG. 1B can selectively activate a gigasonic frequency generator 110 (e.g., generated frequency in the gigahertz range), a megasonic frequency generator 154 (e.g., generated frequency in the megahertz range), or an ultrasonic frequency generator 156 (e.g., generated frequency in the kilohertz range), which can produce different non-overlapping frequency ranges with one another. While the gigasonic frequency generator 110 may produce in waves within cleaning solution 106 without cavitation, the megasonic and ultrasonic frequency generators 154, 156 may produce waves with cavitation to provide flexibility in cleaning procedures. Thus, the cleaning system in FIG. 1B is configured to selectively switch between different frequencies depending on the particles or contaminants to be removed, the cleaning solution, and/or the structure of the wafers 102.

Figure 1C:
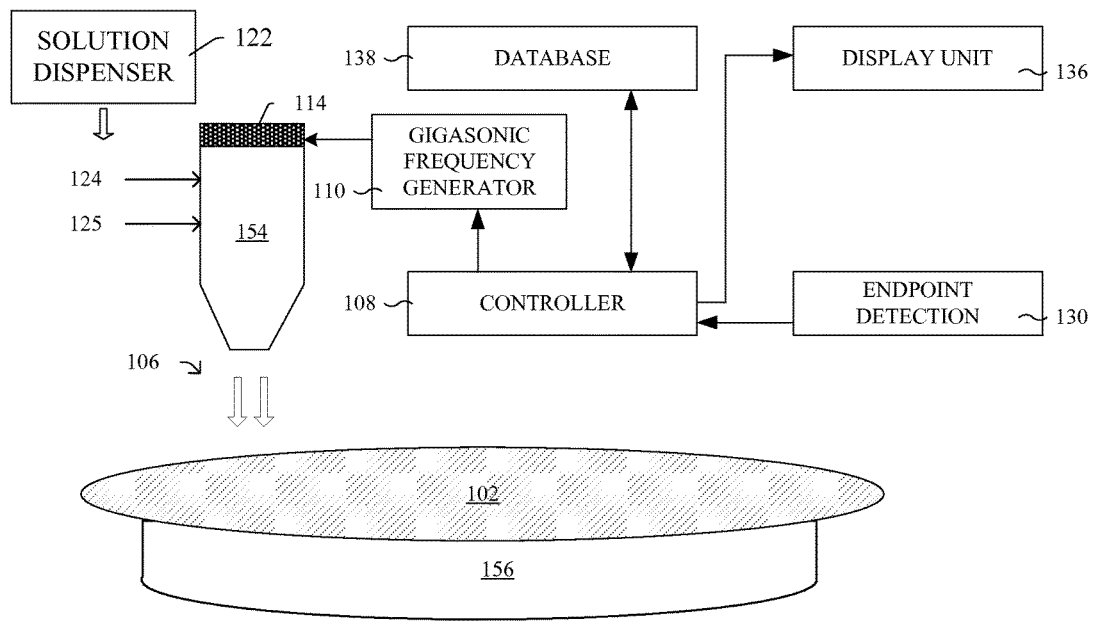

FIGS. 1A and 1B depicts example embodiments of bench type gigasonic cleaning systems. FIG. 1C depicts a nozzle type gigasonic cleaning system. A gigasonic nozzle 154 is configured to apply a cleaning solution 106 with gigasonic cleaning waves. The nozzle 154 receives an electrical signal from the gigasonic frequency generator 110. Additionally, the nozzle 154 is configured to receive a first solution through a first inlet 124 and a gas through a second inlet 125.

The nozzle 154 combines the first solution and the received gas and generates a gas/fluid mixture as the cleaning solution. In one example, the received gas is N2. The gigasonic nozzle 154 also includes a transducer 114 configured to generate gigasonic waves. As a result, the gigasonic nozzle 154 generates and dispenses the cleaning solution 106 having gigasonic waves and as a gas/fluid mixture.

The gigasonic nozzle 154 moves relative to an upper surface of the wafer 102 to selectively dispense the cleaning solution 106 on the upper surface of the wafer 102. The nozzle 154 itself can be configured to move and/or the wafer 102 can be configured to move. Movement of and operation of the gigasonic nozzle 154 is directed by the controller 108. A chuck 156 supports and/or moves the wafer 102, and is also operated as directed by the controller 108.

Figure 1D:
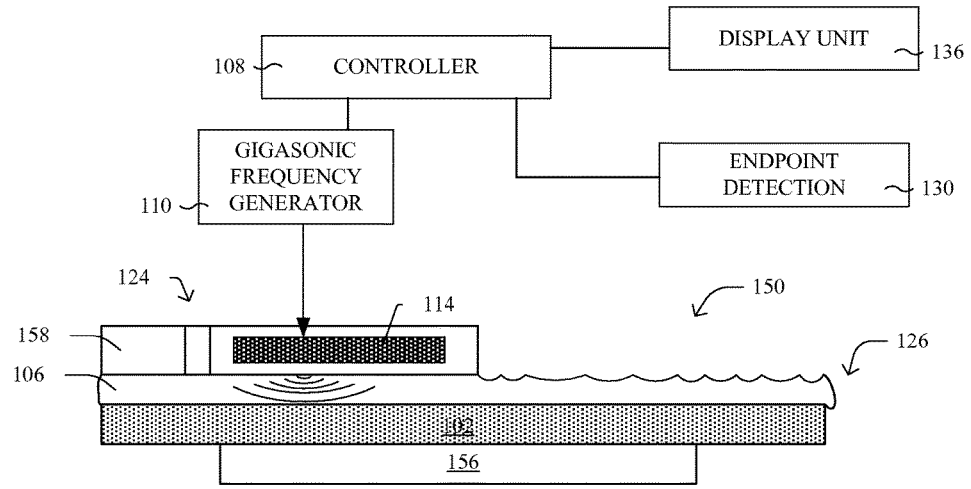

FIG. 1D illustrates an embodiment of a gigasonic cleaning system as a bar type system. The system includes a bar dispenser 158 that applies a cleaning solution 106 to a surface of the wafer 102 and also generates gigasonic cleaning waves. An inlet or nozzle 124 of the dispenser 158 receives a fluid or solution.

The dispenser 158 includes a transducer 114 configured to generate the gigasonic cleaning waves according to an electrical signal from the gigasonic frequency generator 110. The gigasonic cleaning waves are applied to the surface of the wafer in a target area under the bar dispenser 158. The target area is also referred to as a resonant process area. A non-process area 150 where the gigasonic waves are not generally present is also shown.

Figure 2:
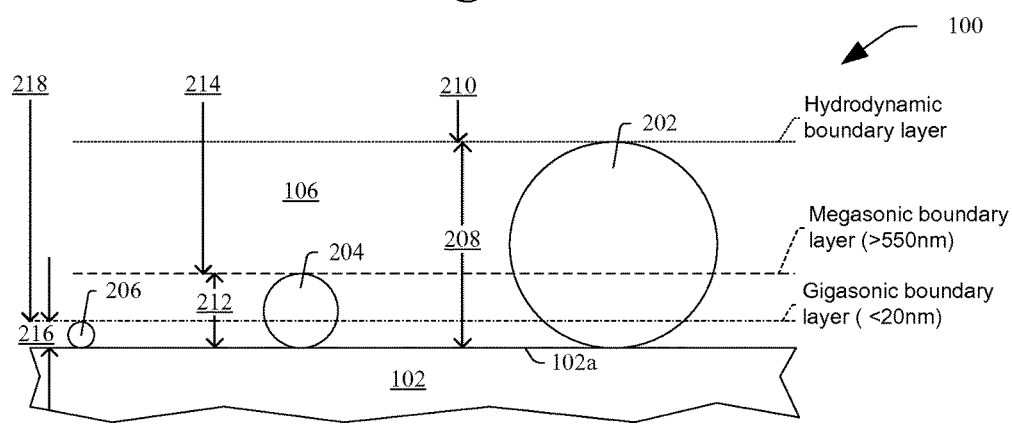
FIG. 2 is a diagram illustrating particle removal using gigasonic cleaning techniques in accordance with some embodiments.

For the gigasonic cleaning, a chuck 156 typically rotates the wafer 102 to move the surface of the wafer 102 in the resonant process area until cleaning is complete, as determined by the endpoint detection 130. FIG. 2 is a diagram illustrating particle removal using gigasonic cleaning techniques, such as performed by the gigasonic cleaning system 100 of FIG. 1. The diagram is provided for illustrative purposes and is not to scale. The diagram shows a portion of wafer 102 having an upper surface 102a in direct fluid contact with the cleaning solution 106. The upper surface 102a can correspond to a bottom surface of a trench, hole, or other feature on the wafer 102, which may be difficult to clean with conventional cleaning techniques, and which includes several particles 202, 204, 206 lodged on upper surface 102a. For purposes of illustration, the particles include a first particle 202 having a first diameter, a second particle 204 having a second diameter, and a third particle 206 having a third diameter, wherein the first, second, and third diameters differ from one another.

In physics and fluid mechanics, a boundary layer is a layer of fluid in the immediate vicinity of a bounding surface where the effects of viscosity are significant. In FIG. 2, several different cleaning techniques making use of different frequencies (and different boundary layers) are illustrated. In the first cleaning technique, a transducer (e.g., 114A, FIG. 1B) drives the cleaning solution 106 at a first frequency, such as an ultrasonic frequency. As shown, when this first frequency is used, the cleaning solution 106 can be divided between a first boundary layer 208 and a first bulk flow region 210 above the first boundary layer 208. However, due to the relatively large thickness of this first boundary layer 208 where viscosity is significant, the mass transport in the first bulk flow region 210 is largely unable to move particles having a size less than or equal to that of the first particle 202. Thus, for the first illustrated frequency, if unwanted particles or contaminants are smaller than the size of first particle 202, the viscous nature of the first boundary layer 208 will leave these unwanted particles or contaminants in place (i.e., un-cleaned). Further, if the first frequency is an ultrasonic cleaning technique, cavitation (bubbles) may provide rigorous cleaning, but may in some cases may damage the wafer 102 and/or features thereon.

When a second frequency, such as a megasonic frequency, the cleaning solution 106 can be divided between a second boundary layer 212 and a second bulk flow region 214 above the second boundary layer 212. In the illustrated example, the second frequency can be on the order of megahertz (e.g., a megasonic signal), and is greater than the first frequency. Because the second frequency corresponds to a second wavelength which is smaller than the wavelength of the first frequency, the second boundary layer 212 is thinner than the first boundary layer 208. Thus, mass transport in the second bulk flow region 214 is now able to remove the first particle 202, although is still unable to remove particles having a size less than or equal to that of the second particle 204. Further, megasonic cleaning techniques can still cause cavitation (bubbles), which may provide rigorous cleaning, but may in some cases undesirably damage the wafer 102 or features thereon.

When a gigasonic frequency is used, the cleaning solution 106 can be divided between a gigasonic boundary layer 216 and a gigasonic bulk flow region 218 above the gigasonic boundary layer 216. In the illustrated example, the gigasonic frequency can be on the order of gigahertz, and is greater than the first frequency and is also greater than the second frequency. Because the gigasonic frequency corresponds to a wavelength which is smaller than the wavelengths of the first and second frequencies, the gigasonic boundary layer 216 is thinner than the first and second boundary layers 208, 212. Thus, the mass transport of the gigasonic bulk flow region 218 is able to remove the first and second particles 202, 204 and particles having sizes down to the size of third particle 206. For example, compared to the megasonic boundary layer 212, which had a thickness of approximately 550 nm or more, the gigasonic boundary layer 216 may have a thickness of approximately 20 nanometers or less, which can represent a reduction in approximately 97% and remove significantly more particles or contaminants. Further, the gigasonic bulk flow region 218 may exhibit a streaming velocity on the order of $\times 10^5$ m/s, for example, which can aid in the swift removal of particles or contaminants. Moreover, gigasonic cleaning techniques do not induce cavitation (bubbles), and therefore can limit damage to wafer 102 and/or small features thereon.

Figure 3:
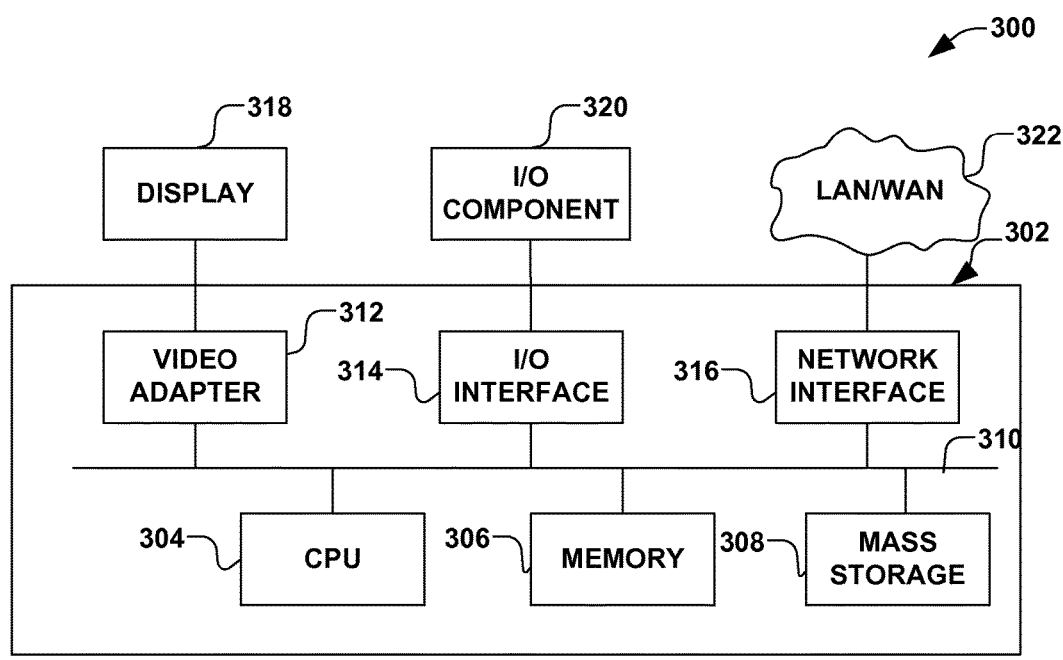
FIG. 3 is a block diagram illustrating a computing environment in which systems or methods according to some embodiments of the present disclosure may be carried out.

In accordance with some embodiments, the aforementioned techniques may be implemented using computer program code in one or more general purpose computer or processor based system, such as in controller 108 in FIG. 1A or FIG. 1B for example. As illustrated in FIG. 3, a block diagram is provided of a processor based system 300 in accordance with another embodiment. The processor based system 300 is a general purpose computer platform and may be used to implement processes discussed herein. The processor based system 300 may include a processing unit 302, such as a desktop computer, a workstation, a laptop computer, or a dedicated unit customized for a particular application. The processor based system 300 may be equipped with a display 318 and one or more input/output devices 320, such as display unit (e.g., 136 FIG. 1A, 1B) or a port to provide data to a database (e.g., 138 FIG. 1A, 1B). The processing unit 302 may include a central processing unit (CPU) 304, memory 306, a mass storage device 308, a video adapter 312, and an I/O interface 314 connected to a bus 310.

The bus 310 may be one or more of any type of several bus architectures including a memory bus or memory controller, a peripheral bus, or video bus. The CPU 304 may include any type of electronic data processor, and the memory 306 may include any type of system memory, such as static random access memory (SRAM), dynamic random access memory (DRAM), or read-only memory (ROM).

The mass storage device 308 may include any type of storage device configured to store data, programs, and other information and to make the data, programs, and other information accessible via the bus 310. The mass storage device 308 may include, for example, one or more of a hard disk drive, a magnetic disk drive, or an optical disk drive.

The video adapter 312 and the I/O interface 314 provide interfaces to couple external input and output devices to the processing unit 302. Examples of input and output devices include the display 318 coupled to the video adapter 312 and the I/O device 320, such as a mouse, keyboard, printer, and the like, coupled to the I/O interface 314. Other devices may be coupled to the processing unit 302, and additional or fewer interface cards may be utilized. For example, a serial interface card (not shown) may be used to provide a serial interface for a printer. The processing unit 302 also may include a network interface 316 that may be a wired link to a local area network (LAN) or a wide area network (WAN) 322 and/or a wireless link.

Further, it should be noted that the modules and devices in FIG. 1 may be implemented on one or more processor based systems 300 of FIG. 3. Communication between the different modules and devices may vary depending upon how the modules are implemented. If the modules are implemented on one processor based system 300, data may be saved in memory 306 or mass storage 308 between the execution of program code for different steps by the CPU 304. The data may then be provided by the CPU 304 accessing the memory 306 or mass storage 308 via bus 310 during the execution of a respective step. If modules are implemented on different processor based systems 300 or if data is to be provided from another storage system, such as a separate database, data can be provided between the systems 300 through I/O interface 314 or network interface 316. Similarly, data provided by the devices or stages may be input into one or more processor based system 300 by the I/O interface 314 or network interface 316. A person having ordinary skill in the art will readily understand other variations and modifications in implementing systems and methods that are contemplated within the scope of varying embodiments.

Figure 4:
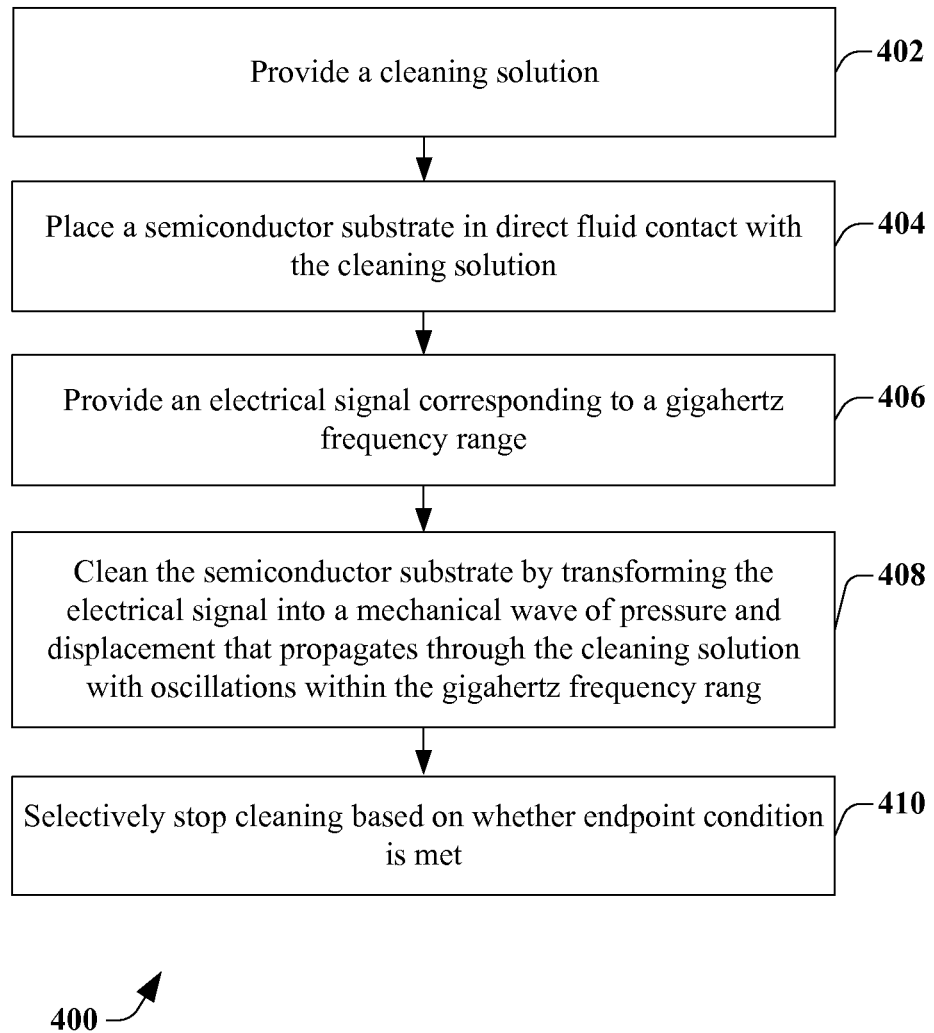
FIG. 4 is a flow diagram illustrating a method of removing particles from semiconductor devices in accordance with some embodiments.

FIG. 4 is a flow diagram illustrating a method 400 of removing particles from semiconductor devices. The method 400 removes particles without substantially damaging surfaces and features of the semiconductor devices.

At 402, a cleaning solution is provided.

At 404, a semiconductor substrate is placed in direct fluid contact with the cleaning solution.

At 406, an electrical signal corresponding to a gigahertz frequency range is provided.

At 408, the semiconductor substrate is cleaned by transforming the electrical signal into a mechanical wave of pressure and displacement that propagates through the cleaning solution with oscillations within the gigahertz frequency range.

At block 410, generation of the selected frequency is selectively stopped, based on whether an end point condition is detected for the cleaning. In some embodiments, the endpoint condition is met if a cleaning time has a predetermined relationship with a predetermined time. For example, if gigasonic cleaning is to occur for a predetermined time of five minutes, the predetermined time could be five minutes measured from the initial start of cleaning, and the predetermined relationship would be met when the elapsed cleaning time is equal to five minutes. In other embodiments, the endpoint condition is met if optical imaging determines contaminants and/or unwanted particles are sufficiently removed from the surface of wafer, or if contaminant- or unwanted particle-concentrations within the cleaning fluid are sufficiently "flat" over time. If this "flat" condition is detected, it can indicate that contaminants or unwanted particles are no longer being dislodged from the surfaces of wafers 102 in a significant manner, and the endpoint condition is met.

While the disclosed method (e.g., the method described by FIG. 4) is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

As can be appreciated from above, the present disclosure provides a semiconductor cleaning system. The cleaning system includes a chamber to retain a cleaning solution, and a gigasonic frequency generator. The gigasonic frequency generator is configured to generate an electrical signal corresponding to a range of gigahertz frequencies. A transducer is configured to transform the electrical signal to a mechanical wave of pressure and displacement that propagates through the cleaning solution with oscillations within the range of gigahertz frequencies.

The present disclosure also provides an acoustic cleaning arrangement. In this arrangement, a chamber is configured to hold a semiconductor device for gigasonic cleaning. A solution dispenser is configured to dispense a cleaning solution into the chamber. A first transducer is proximate the chamber and configured to generate transducer energy at a transducer frequency, wherein the transducer frequency is within a gigahertz frequency range. A gigasonic frequency generator is coupled to the first transducer and configured to cause the first transducer to generate the transducer energy. The gigasonic frequency generator is also configured cause the first transducer to subject the semiconductor device to a mechanical wave of pressure and displacement that propagates through the cleaning solution with oscillations within the gigahertz frequency range to cause removal of particles or contaminants from the semiconductor device.

Still other embodiments relate to a method of removing particles from semiconductor devices. In this method, a cleaning solution is provided. A semiconductor substrate is placed in direct fluid contact with the cleaning solution. An electrical signal is provided to correspond to a gigahertz frequency range. The semiconductor substrate is cleaned by transforming the electrical signal into a mechanical wave of pressure and displacement that propagates through the cleaning solution with oscillations within the gigahertz frequency range.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Moreover, "first", "second", "third", etc. may be used herein for ease of description to distinguish between different elements of a figure or a series of figures. "first", "second", "third", etc. are not intended to be descriptive of the corresponding element. Therefore, "a first dielectric layer" described in connection with a first figure may not necessarily corresponding to a "first dielectric layer" described in connection with another figure.

What is claimed is:

1. A semiconductor cleaning system comprising:
   a chamber having sidewalls connected to a bottom plate and defining an interior region and an exterior region, the interior region configured to retain a cleaning solution and a semiconductor wafer, and the exterior region being separated from the cleaning solution;
   a first frequency generator configured to generate electrical signals having a first frequency in a range of gigahertz frequencies;
   a second frequency generator configured to generate electrical signals having a second frequency in a range of megahertz or ultrasonic frequencies;
   a first transducer arranged on the exterior region of the chamber, and mechanically coupled to the bottom plate such that an upper surface of the first transducer is both below a topmost surface of the bottom plate and above a bottommost surface of the bottom plate, and wherein the first transducer is electrically coupled to one of the first or second frequency generators; and
   a second transducer arranged on the exterior region of the chamber, mechanically coupled to the sidewall and electrically coupled to another of the first or second frequency generators; and
   a controller configured to select one of the first or second frequencies for application by the first transducer to the cleaning solution and to select the other of the first or second frequencies for application by the second transducer to the cleaning solution, the controller configured to make the selection of the one frequency and the other frequency, which are different, based on size of unwanted particles to be removed from the semiconductor wafer.

2. The system of claim 1, wherein the chamber is configured to retain the semiconductor wafer in direct fluid communication with the cleaning solution, wherein the semiconductor wafer includes the unwanted particles or contaminants including photoresist on a surface of the semiconductor wafer.

3. The system of claim 2, wherein a first group of the unwanted particles are smaller than about 20 nanometers.

4. The system of claim 3, wherein a second group of the unwanted particles are smaller than about 550 nanometers.

5. The system of claim 2, wherein the semiconductor wafer includes trench features and wherein at least a portion of the unwanted particles are at surfaces of the trench features.

6. The system of claim 2, wherein the system is configured to substantially remove the unwanted particles from the semiconductor wafer using the cleaning solution without substantially removing other material from the semiconductor wafer.

7. The system of claim 2, wherein the first transducer or the second transducer generates mechanical waves of pressure and displacement that propagate through the cleaning solution without causing cavitation.

8. The system of claim 7, wherein the first transducer is coupled to the first frequency generator and is configured to induce a gigasonic boundary layer within 20 nanometers of the surface of the semiconductor wafer.

9. The system of claim 8, wherein the first transducer is configured to induce a gigasonic bulk flow region abutting the gigasonic boundary layer and extending outwardly away from the gigasonic boundary layer relative to the surface of the semiconductor wafer.

10. The system of claim 9, wherein the gigasonic bulk flow region exhibits a streaming velocity on an order of 105 m/s.

11. The system of claim 2, wherein the controller is coupled to the first frequency generator and coupled to an endpoint detection unit, wherein the endpoint detection unit is configured to detect a level of contaminants, and wherein the endpoint detection unit monitors the surface of the semiconductor wafer or the cleaning solution and transmits a signal to the controller that cleaning is complete based on the level of contaminants.

12. The system of claim 1, further comprising:
   a support structure, arranged over the bottom plate, that has a first groove and a second groove, wherein the first groove and the second groove are configured to respectively hold a first semiconductor wafer and a second semiconductor wafer such that faces of the first and second semiconductor wafers are parallel to one another and perpendicular to the bottom plate.

13. A semiconductor cleaning system comprising:
   a chamber comprising sidewalls connected to a bottom plate and configured to retain a cleaning solution;
   a semiconductor wafer disposed within the chamber, wherein the semiconductor wafer includes unwanted particles on a face of the semiconductor wafer;
   a wafer support structure arranged above the bottom plate and configured to hold the semiconductor wafer in a vertical orientation such that the face of the semiconductor wafer is perpendicular to the bottom plate of the chamber;

a first frequency generator configured to generate first electrical signals having a first range of frequencies comprising a gigahertz frequency, and a second frequency generator configured to generate second electrical signals having a second range of frequencies comprising a megahertz or ultrasonic frequency;

a first transducer coupled to the first frequency generator and configured to transform the first electrical signals to a first mechanical wave of pressure and displacement that propagates through the cleaning solution in a first direction;

a second transducer coupled to the second frequency generator and configured to transform the second electrical signals to a second mechanical wave of pressure and displacement that propagates through the cleaning solution in a second direction, wherein the first and second transducers are independently movable along substantially orthogonal axes arranged along the sidewalls and the bottom plate, respectively; and a controller configured to select one of the first or second range of frequencies for application by the first transducer to the cleaning solution and to select the other of the first or second range of frequencies for application by the second transducer to the cleaning solution, the controller configured to make the selection based on a particle size of at least one of the unwanted particles to be removed from the semiconductor wafer.

14. The system of claim 13, where the controller is coupled to the first and second frequency generators and coupled to an endpoint detection unit, wherein the endpoint detection unit is configured to detect a level of the unwanted particles, and wherein the endpoint detection unit monitors the face of the semiconductor wafer or the cleaning solution and signals the controller that cleaning is completed based on the level of the unwanted particles.

15. The system of claim 13, wherein the first transducer generates the first mechanical wave of pressure and displacement at a first frequency and at a first power level, and the second transducer generates the second mechanical wave of pressure and displacement at a second frequency and at a second power level, and wherein the first frequency differs from the second frequency, and wherein the first power level differs from the second power level.

16. The system of claim 13, wherein a first group of the unwanted particles are smaller than about 20 nanometers.

17. The system of claim 16, wherein a second group of the unwanted particles are smaller than about 550 nanometers.

18. The system of claim 17, wherein the first electrical signals are selected to remove the first group of the unwanted particles from the semiconductor wafer, and the second electrical signals are selected to remove the second group of the unwanted particles from the semiconductor wafer.

19. A semiconductor cleaning system comprising:

a chamber having sidewalls connected to a bottom plate and defining an interior volume configured to clean first and second semiconductor wafers in a cleaning solution;

a wafer support structure, arranged above the bottom plate, configured to hold the first and second semiconductor wafers, wherein the first and second semiconductor wafers have a first face and a second face, respectively, and wherein the first face is parallel to the second face and is perpendicular to the bottom plate of the chamber;

a first frequency generator configured to generate a first electrical signal comprising a gigahertz frequency range, and a second frequency generator configured to generate a second electrical signal comprising a megasonic or ultrasonic frequency range;

a first transducer positioned along the bottom plate of the chamber and coupled to at least one of the first or second frequency generators and configured to transform one of the first or second electrical signals to a first mechanical wave of pressure and displacement that propagates through the cleaning solution; and wherein the first transducer is movable along one or more first axes;

a second transducer positioned along the sidewalls of the chamber, wherein the second transducer is configured to transform the other of the first or second electrical signals to a second mechanical wave of pressure and displacement that propagates through the cleaning solution, and wherein the second transducer is movable along one or more second axes different than the one or more first axes;

a controller configured to select one of the gigahertz frequency range or the megasonic or ultrasonic frequency range for application by the first transducer to the cleaning solution and to select the other of the gigahertz frequency range or the megasonic or ultrasonic frequency range for application by the second transducer to the cleaning solution, the controller configured to make the selection based on a particle size of at least one unwanted particle to be removed from the first and second semiconductor wafers.

20. The system of claim 19, wherein at least one of the one or more second axes is substantially orthogonal to the at least one of the one or more first axes.

* * * * *